(12) United States Patent
Oshima (10) Patent No.: US 8,898,531 B2
(45) Date of Patent: Nov. 25, 2014

(54) TEST APPARATUS AND TEST METHOD

(75) Inventor: Hiromi Oshima, Gunma (JP)

(73) Assignee: Advantest Corporation, Tokyo (JP)

( * ) Notice: Subject to any disclaimer, the term of this patent is extended or adjusted under 35 U.S.C. 154(b) by 195 days.

(21) Appl. No.: 13/445,928

(22) Filed: Apr. 13, 2012

(65) Prior Publication Data

US 2012/0299606 A1 Nov. 29, 2012

(30) Foreign Application Priority Data

May 27, 2011 (JP) ................................ 2011-119660

(51) Int. Cl.
*G01R 31/28* (2006.01)
*G06F 11/00* (2006.01)
*G11C 29/56* (2006.01)

(52) U.S. Cl.
CPC .............. *G11C 29/56012* (2013.01)
USPC ........................................................ 714/736

(58) Field of Classification Search
CPC ................... G11C 29/56012; G01R 31/31726; G01R 31/31919; G01R 31/31932; G01R 31/31937
USPC .............. 714/736, 3, 703, 742, 799, 735, 744
See application file for complete search history.

(56) References Cited

U.S. PATENT DOCUMENTS

| | | | | |
|---|---|---|---|---|
| 4,541,100 | A * | 9/1985 | Sutton et al. | 375/224 |
| 7,100,099 | B2 * | 8/2006 | Niijima | 714/744 |
| 7,644,324 | B2 | 1/2010 | Arasawa | |
| 7,840,858 | B2 * | 11/2010 | Fujibe | 714/700 |
| 8,718,123 | B2 * | 5/2014 | Yoshiba et al. | 375/226 |
| 2009/0006025 | A1 * | 1/2009 | Fujibe | 702/125 |
| 2012/0299600 | A1 * | 11/2012 | Oshima | 324/537 |
| 2012/0300826 | A1 * | 11/2012 | Yoshiba et al. | 375/226 |
| 2012/0304009 | A1 * | 11/2012 | Oshima | 714/33 |
| 2012/0331346 | A1 * | 12/2012 | Oshima | 714/32 |

FOREIGN PATENT DOCUMENTS

| | | |
|---|---|---|
| JP | 2008-4237 A | 1/2008 |
| KR | 10-2010-0034030 A | 3/2010 |
| WO | 2008/007636 A1 | 1/2008 |
| WO | 2009/001451 A1 | 12/2008 |

OTHER PUBLICATIONS

Notice of Office Action for Korean Appl. No. 10-2012-0042693, issued by the Korean Intellectual Property Office on Jul. 19, 2013.
Notice of Reasons for Rejection issued by the Japan Patent Office for application No. 2011-119660.
Notice of First Office Action for Patent Application No. 201210170582.9, issued by the Chinese Intellectual Property Office on Aug. 5, 2014.

* cited by examiner

*Primary Examiner* — Phung M Chung (57) ABSTRACT

Provided is a test apparatus that tests a device under test outputting a data signal and a clock signal indicating a timing at which the data signal is to be sampled, the test apparatus comprising a data acquiring section that acquires the data signal output by the device under test, at a timing corresponding to the clock signal output by the device under test; a masking section that masks the acquisition of data by the data acquiring section, while the device under test is not outputting the clock signal; and a judging section that judges pass/fail of the device under test based on a result of a comparison between the data signal acquired by the data acquiring section and an expected value.

20 Claims, 8 Drawing Sheets

TEST APPARATUS AND TEST METHOD

BACKGROUND

1. Technical Field

The present invention relates to a test apparatus and a test method.

2. Related Art

An interface is known that is referred to as "source-synchronous," in which a clock signal is output in synchronization with a data signal. Patent Document 1 describes a test apparatus that tests a device under test adopting such an interface. The test apparatus in Patent Document 1 samples a data signal using a clock signal output from the device under test, and compares the sampled data signal to an expected value.

Patent Document 1: U.S. Pat. No. 7,644,324

However, a device that adopts a source-synchronous interface does not continuously output a data signal and a clock signal, and stops the output of the data signal and the clock signal at certain times. Accordingly, when testing a device under test that adopts a source-synchronous interface, the test apparatus must stop the acquisition of data in the periods during which the device under test stops outputting the data signal and the clock signal.

SUMMARY

To solve the above problems, according to a first aspect related to the innovations herein, provided is a test apparatus that tests a device under test outputting a data signal and a clock signal indicating a timing at which the data signal is to be sampled, the test apparatus comprising a data acquiring section that acquires the data signal output by the device under test, at a timing corresponding to the clock signal output by the device under test; a masking section that masks the acquisition of data by the data acquiring section, while the device under test is not outputting the clock signal; and a judging section that judges pass/fail of the device under test based on a result of a comparison between the data signal acquired by the data acquiring section and an expected value.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
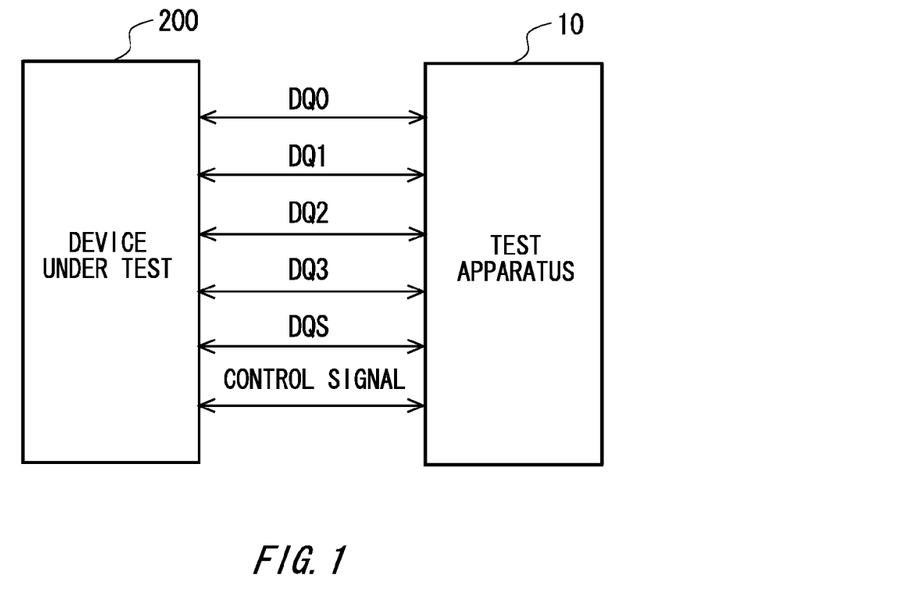
FIG. 1 shows a device under test 200 and a test apparatus 10 that tests the device under test 200, according to an embodiment of the present invention.
Figure 2:
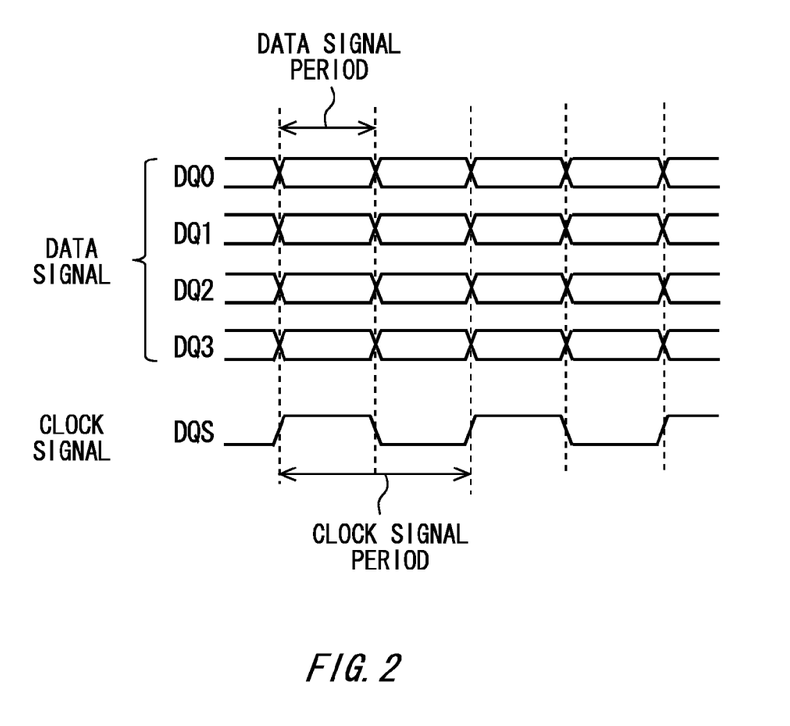
FIG. 2 shows timings of a data signal and clock signal output from the device under test 200.

FIG. 1 shows a device under test 200 and a test apparatus 10 that tests the device under test 200, according to an embodiment of the present invention. FIG. 2 shows timings of a data signal and clock signal output from the device under test 200.

The test apparatus 10 according to the present embodiment tests the device under test 200. In the present embodiment, the device under test 200 exchanges data with another device via a DDR (Double Data Rate) interface, which is a bidirectional bus.

The DDR interface transmits a plurality of data signals DQ and a clock signal DQS, which indicates the timing at which the data signals DQ are sampled, in parallel. In the present example, as shown in FIG. 2, the DDR interface transmits one clock signal DQS for four data signals DQ0, DQ1, DQ2, and DQ3. Furthermore, the DDR interface transmits the data signals DQ at a rate that is twice the rate of the clock signal DQS and synchronized with the clock signal DQS.

In the present embodiment, the device under test 200 is a non-volatile memory device, for example, and writes and reads data to and from another control device via the DDR interface. The test apparatus 10 of the present embodiment tests the device under test 200 by exchanging the data signals DQ and clock signal DQS with the device under test 200 via the DDR interface, which is a bidirectional bus. Furthermore, the test apparatus 10 exchanges control signals, such as write enable signals and read enable signals, with the device under test 200.

Figure 3:
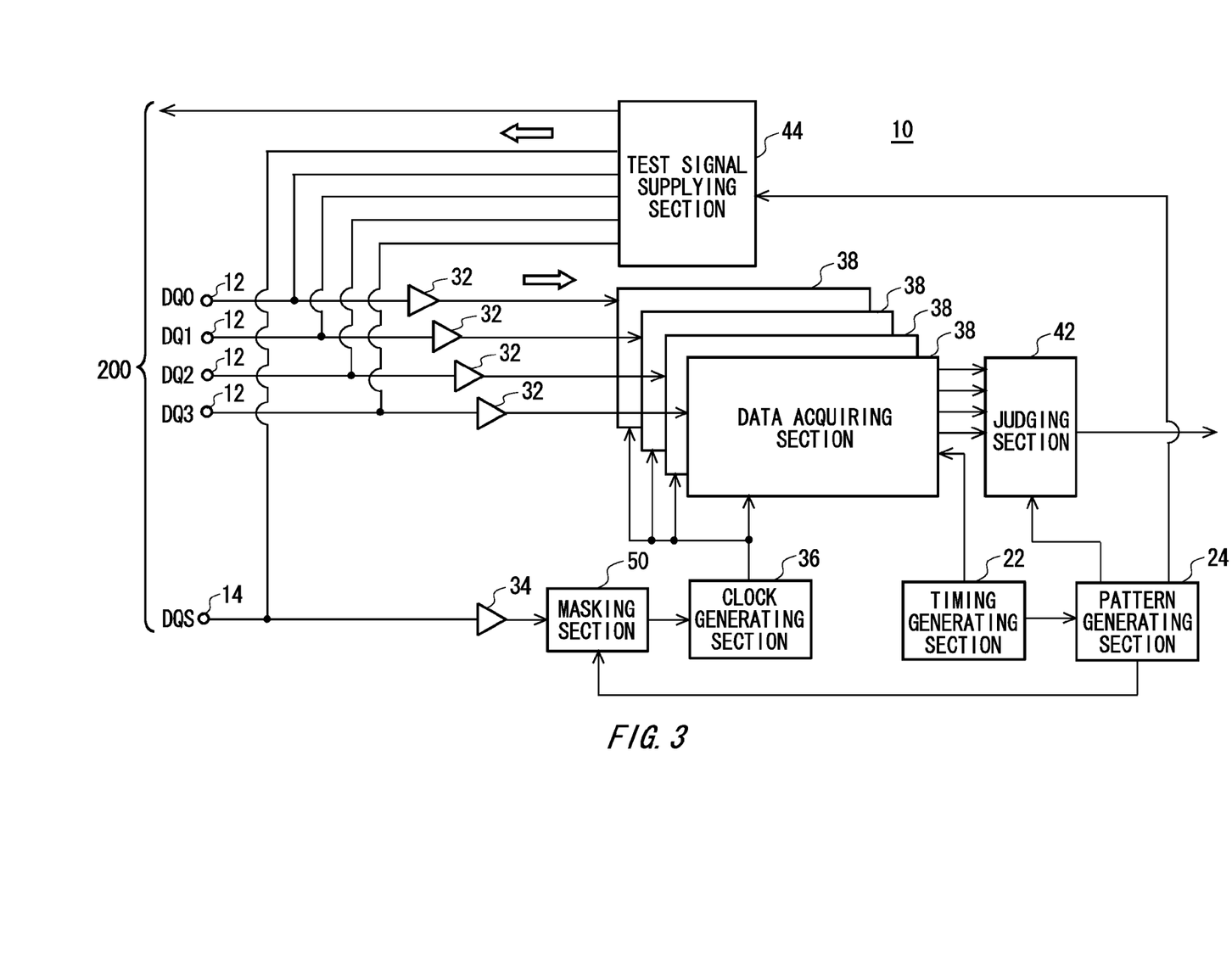
FIG. 3 shows a configuration of the test apparatus 10 according to the present embodiment.

FIG. 3 shows a configuration of the test apparatus 10 according to the present embodiment. The test apparatus 10 includes a plurality of data terminals 12, a clock terminal 14, a timing generating section 22, a pattern generating section 24, a plurality of data comparators 32, a clock comparator 34, a clock generating section 36, a plurality of data acquiring sections 38, a judging section 42, a test signal supplying section 44, and a masking section 50.

Each data terminal 12 is connected to an input/output terminal for a data signal in the device under test 200, via the DDR interface that is a bidirectional bus. In this example, the test apparatus 10 includes four data terminals 12. The four data terminals 12 are connected respectively to the input/output terminals for the four data signals DQ0, DQ1, DQ2, and DQ3 of the device under test 200, via the DDR interface. The clock terminal 14 is connected to an input/output terminal for the clock signal DQS of the device under test 200, via the DDR interface.

The timing generating section 22 generates a timing signal corresponding to the test period of the test apparatus 10, based on a reference clock generated within the test apparatus 10. The timing generating section 22 may generate a timing signal synchronized with the test period, for example.

The pattern generating section 24 generates an expected value pattern representing an expected value of the data signal to be output from the device under test 200. The pattern generating section 24 generates a test pattern representing a waveform of the test signal to be supplied to the device under test 200. The pattern generating section 24 may generate the expected value pattern and the test pattern according to the execution of a program, for example.

The data comparators 32 are provided to correspond respectively to the data signals exchanged with the device under test 200 via the DDR interface. In the present example, the test apparatus 10 includes four data comparators 32 corresponding respectively to the four data signals DQ0, DQ1, DQ2, and DQ3. Each data comparator 32 receives the corresponding data signal output from the device under test 200, via the corresponding data terminal 12. Each data comparator 32 compares the received data signal to a predetermined threshold level to convert the data signal into a logic value, and outputs the data signal as a logic value.

The clock comparator 34 is provided to correspond to the clock signal DQS exchanged with the device under test 200 via the DDR interface. The clock comparator 34 receives the corresponding clock signal output from the device under test 200 via the corresponding clock terminal 14. The clock comparator 34 compares the received clock signal to a predetermined threshold level to convert the clock signal into a logic value, and outputs the clock signal as a logic value.

The clock generating section 36 generates a sampling clock for sampling the data signals output from the device under test 200, based on the clock signal expressed as a logic value from the clock comparator 34. In this example, the clock generating section 36 generates a sampling clock having a rate that is twice that of the clock signal.

The data acquiring sections 38 are provided to correspond respectively to the data signals output by the device under test 200 via the DDR interface. In this example, the test apparatus 10 includes four data acquiring sections 38 corresponding respectively to the four data signals DQ0, DQ1, DQ2, and DQ3.

The data acquiring sections 38 acquire the data signals output by the device under test 200 at a timing of the sampling clock corresponding to the clock signal. In the present embodiment, each data acquiring section 38 acquires the data value of the corresponding data signal at the timing of the sampling clock generated by the clock generating section 36.

Each data acquiring section 38 outputs the acquired data signal at the timing of the timing signal generated within the test apparatus 10. In the present embodiment, each data acquiring section 38 outputs each data value of the data signal acquired at the timing of the timing signal generated by the timing generating section 22.

As a result, each data acquiring section 38 can acquire the data signal output from the device under test 200, at a timing corresponding to the clock signal output from the device under test 200, and output the acquired clock at a timing synchronized with the internal reference clock of the test apparatus 10. In other words, each data acquiring section 38 can switch the clock of the data signal from being aligned with the clock signal output from the device under test 200 to being aligned with the reference clock generated within the test apparatus 10.

The judging section 42 judges pass/fail of the device under test 200 based on the result of the comparisons between the expected value and the data signal acquired by each data acquiring section 38. In the present embodiment, the judging section 42 compares the data value of the data signal output by each data acquiring section 38 to the expected value indicated by an expected value pattern generated by the judging section 42. In the present embodiment, the judging section 42 judges that the device under test 200 is a pass when the each of the data values of the data signals acquired by the data acquiring sections 38 matches the expected value.

The test signal supplying section 44 supplies the test signal to the device under test 200 according to the test pattern generated by the pattern generating section 24. In the present embodiment, the test signal supplying section 44 outputs, as the test signal, a plurality of data signals as the test signal to the device under test 200, via the DDR interface, a clock signal indicating the sampling timing of the output data signals to the device under test 200 via the DDR interface. In other words, the test signal supplying section 44 outputs the data signals DQ0, DQ1, DQ2, and DQ3 to the device under test 200 via the data terminals 12, and outputs the clock signal DQS to the device under test 200 via the clock terminal 14.

Furthermore, the test signal supplying section 44 supplies the device under test 200 with a read enable signal that permits data output, as a control signal. As a result, the test signal supplying section 44 can cause the data signals DQ including data stored in the device under test 200 to be output from the device under test 200 via the DDR interface.

The masking section 50 masks the data acquisition of the data acquiring sections 38, for a period during which the device under test 200 does not output a clock signal. In other words, when the device under test 200 is not outputting a clock signal, the masking section 50 stops the data acquisition operation of the data acquiring sections 38.

The masking section 50 designates a period during which the device under test 200 does not output the clock signal, by using the pattern generating section 24 operating according to a test program, for example. In other words, the masking section 50 switches between masking the data acquisition operation of the data acquiring sections 38 and permitting the operation, according to the test pattern generated by the pattern generating section 24.

In the present embodiment, the masking section 50 masks the sampling clocks supplied to the data acquiring sections 38 when the device under test 200 is not outputting the clock signal. In other words, in the present embodiment, the masking section 50 supplies the data acquiring sections 38 with the sampling clocks while the device under test 200 is outputting a clock signal, and masks the sampling clock with a fixed value while the device under test 200 is not outputting the clock signal.

For example, the masking section 50 may mask the sampling clock supplied to the data acquiring sections 38 by using a mask circuit to mask the clock signal at a stage when the clock signal is input to the clock generating section 36. As another example, the masking section 50 may mask the sampling clock supplied to the data acquiring sections 38 by using a mask circuit to mask the sampling clock at a stage when the sampling clock is output from the clock generating section 36.

The masking section 50 may mask the data signals or the sampling clock within the buffer section 54. For example, the masking section 50 may mask the data signals or the sampling clock at a stage prior to a buffer, such as a FIFO buffer, within the buffer section 54.

Figure 4:
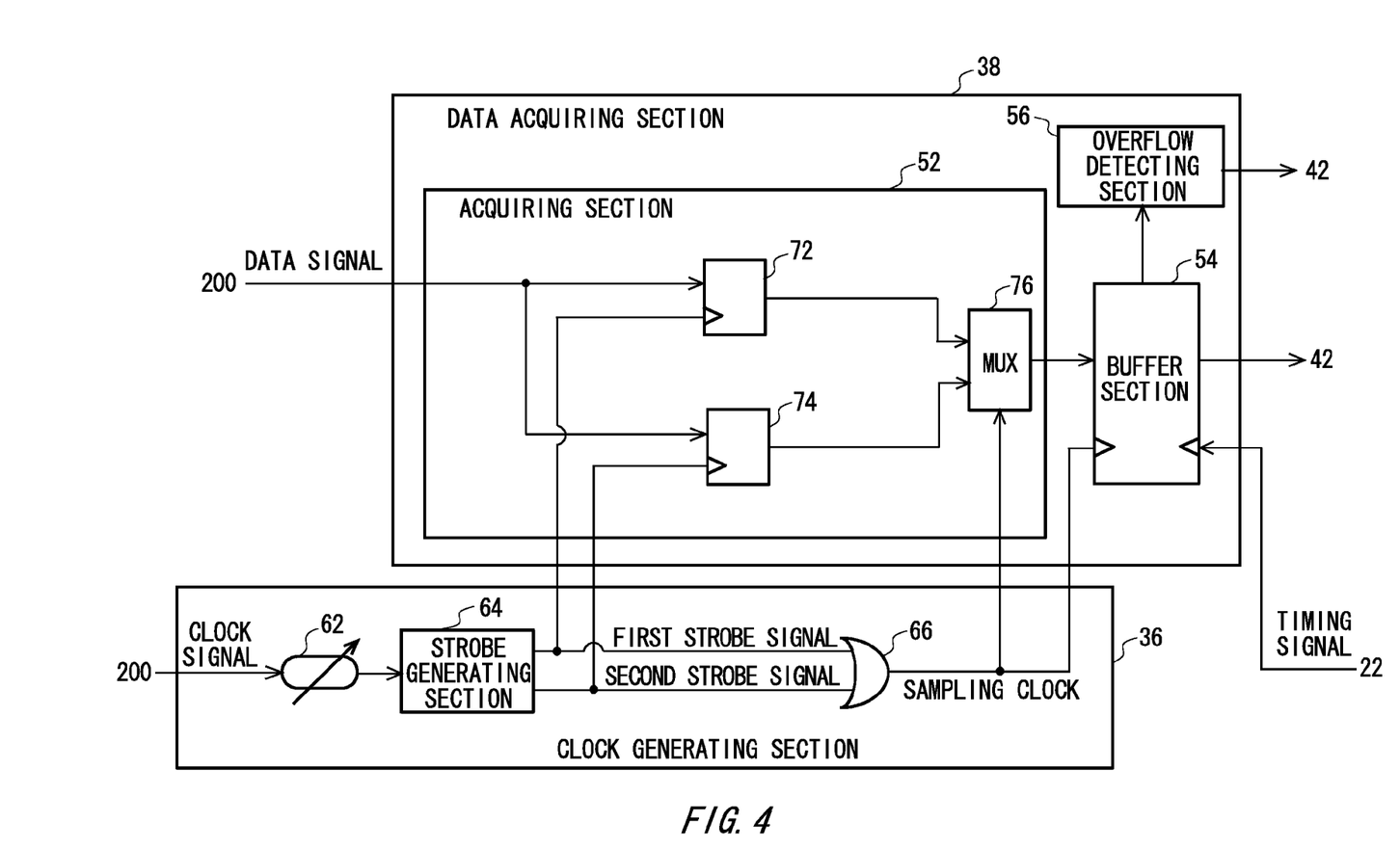
FIG. 4 shows exemplary configurations of the clock generating section 36 and a data acquiring section 38.
Figure 5:
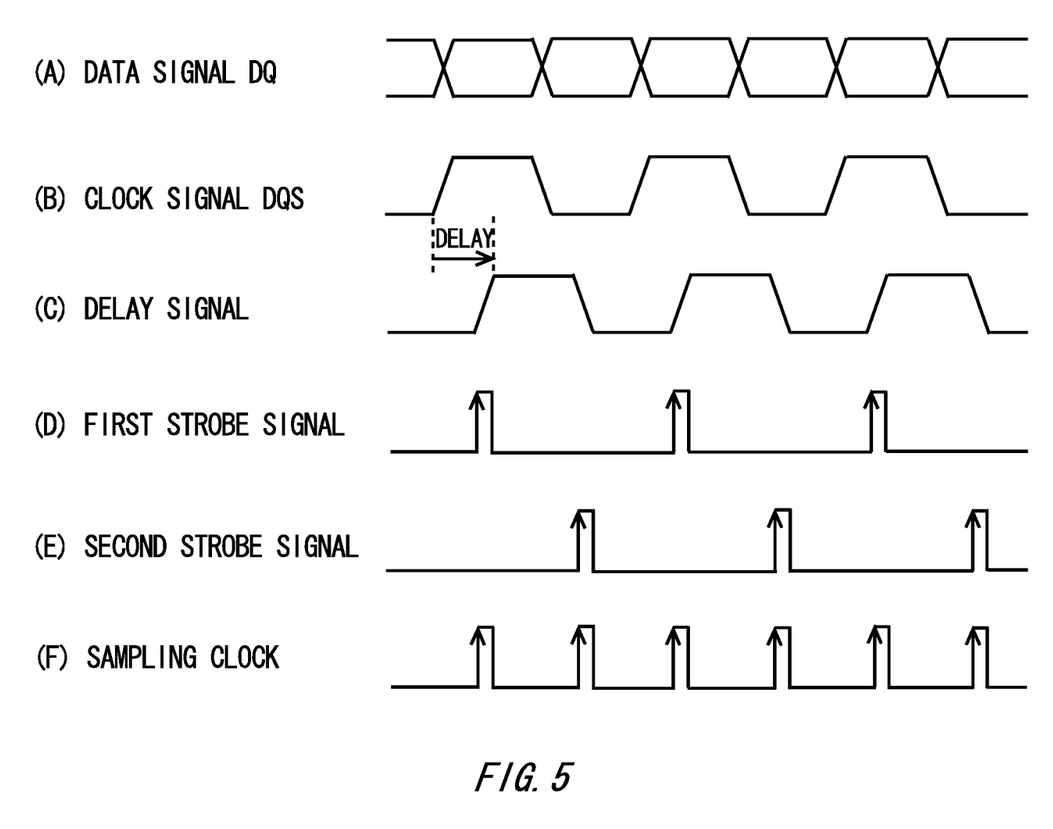
FIG. 5 shows exemplary timings of a data signal, a clock signal, a delay signal, a first strobe signal, a second strobe signal, and a sampling clock.

FIG. 4 shows exemplary configurations of the clock generating section 36 and a data acquiring section 38. FIG. 5 shows exemplary timings of a data signal, a clock signal, a delay signal, a first strobe signal, a second strobe signal, and a sampling clock.

The data acquiring section 38 inputs a data signal including a data value to be transmitted at a predetermined data rate, as shown by (A) in FIG. 5. The data acquiring section 38 sequentially samples the data value included in the data signal DQ, at the timing of the sampling clock generated by the clock generating section 36.

The clock generating section 36 includes a delay device 62, a strobe generating section 64, and a combining section 66, for example. The delay device 62 receives from the device under test 200 a clock signal DQS with a rate that is half that of the data signal DQ, such as shown by (B) in FIG. 5. The delay device 62 outputs a delay signal obtained by temporally delaying the received clock signal DQS by ¼ the period of the clock signal DQS, such as shown by (C) in FIG. 5.

The strobe generating section 64 generates a first strobe signal having a pulse with a very small time width at the rising edge of the delay signal, such as shown by (D) in FIG. 5. In this way, the clock generating section 36 can output the first strobe indicating the timing at which the odd-numbered data values of the data signal DQ are to be sampled.

The strobe generating section 64 generates a second strobe signal having a pulse with a very small time width at the falling edge of the delay signal, such as shown by (E) in FIG. 5. In this way, the clock generating section 36 can output the second strobe indicating the timing at which the even-numbered data values of the data signal DQ are to be sampled. Instead, the first strobe signal may indicate the timings at which the even-numbered data values of the data signal DQ are to be sampled and the second strobe signal may indicate the timings at which the odd-numbered data values of the data signal DQ are to be sampled.

The combining section 66 outputs a sampling clock obtained by combining the first strobe signal and the second strobe signal, as shown by (F) in FIG. 5. For example, the combining section 66 outputs a sampling clock obtained by calculating the OR of the first strobe signal and the second strobe signal. In this way, the combining section 66 can output a sampling clock indicating a timing that is substantially in the center of the eye opening between data values included in the data signal DQ.

The data acquiring section 38 includes an acquiring section 52, a buffer section 54, and an overflow detecting section 56. The acquiring section 52 acquires the data value of the data signal DQ shown in (A) of FIG. 5, at the timing of the sampling clock shown in (F) of FIG. 5. The acquiring section 52 includes an odd-number flip-flop 72, an even-number flip-flop 74, and a multiplexer 76, for example.

The odd-number flip-flop 72 acquires the data value of the data signal DQ output from the device under test 200, at the timing of the first strobe signal, and holds these data values therein. The even-number flip-flop 74 acquires the data value of the data signal DQ output from the device under test 200, at the timing of the second strobe signal, and holds these data values therein.

The multiplexer 76 selects the data values of the data signal DQ held in the odd-number flip-flop 72 and the data values of the data signal DQ held in the even-number flip-flop 74 alternately at the timing of the sampling clock, and supplies the selected values to the buffer section 54. In this way, the acquiring section 52 can acquire the data value of the data signal DQ at the timing corresponding to the sampling clock generated by the clock generating section 36.

The buffer section 54 includes a plurality of entries. The buffer section 54 buffers the data values of the data signal DQ output sequentially from the multiplexer 76 of the acquiring section 52, sequentially in entries therein at the timing of the sampling clock signal generated by the clock generating section 36. Furthermore, the buffer section 54 outputs the data values of the data signal DQ buffered in the entries therein, in the order in which the data values were input, at the timing of the timing signal generated according to the test period of the test apparatus 10.

The buffer section 54 supplies the judging section 42 with the output data values of the data signal DQ. The clock generating section 36 and the data acquiring section 38 described above can acquire the data values of the data signal DQ output from the device under test 200 at a timing corresponding to the clock signal DQS, and supply the judging section 42 with the acquired data values of the data signal DQ at the timing of the timing signal generated within the test apparatus 10.

The overflow detecting section 56 detects whether the buffer section 54 has overflown. In response to an overflow of the buffer section 54, the overflow detecting section 56 stores information indicating the occurrence of an overflow in an internal register, for example. The information indicating the occurrence of an overflow is read by a test control section when testing is finished, for example. When the information indicating the occurrence of an overflow is read, the test control section determines that the test was not executed correctly, and therefore judges that the corresponding device under test 200 is a fail or performs a retest of the corresponding device under test 200, for example.

Figure 6:
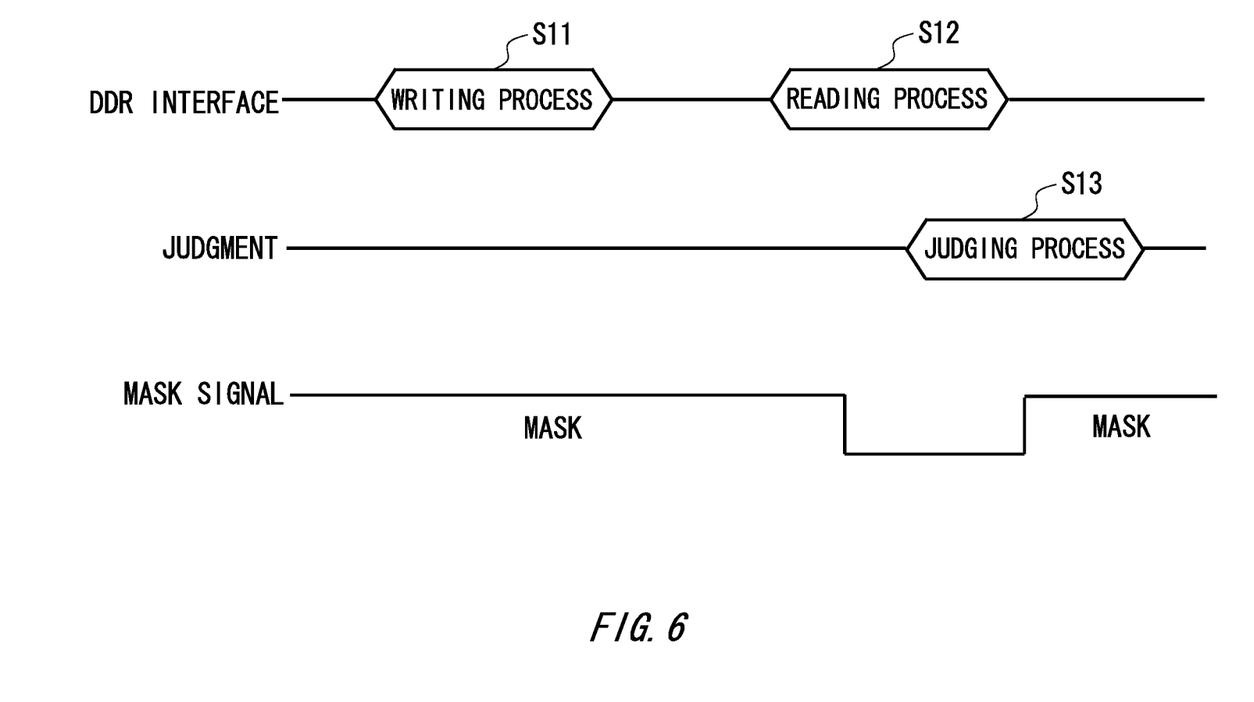
FIG. 6 shows a timing chart of a case in which a function test is performed on a device under test 200 that is a memory device.

FIG. 6 shows a timing chart of a case in which a function test is performed on a device under test 200 that is a memory device. The device under test 200 is a memory device that exchanges data with another device via a DDR interface, which is a bidirectional bus. When testing a device under test 200 that is a memory device, the test apparatus 10 operates in the following manner.

First, at step S11, the test apparatus 10 writes predetermined data to the address region to be tested in the device under test 200. Next, at step S12, the test apparatus 10 reads the data written to the address region to be tested in the device under test 200. At step S13, the test apparatus 10 compares the read data to the expected value, and judges whether the address region under test in the device under test 200 is operating correctly. The test apparatus 10 can judge pass/fail of the device under test 200 by performing such a process on all of the address regions in the device under test 200.

Here, the masking section 50 masks the data acquisition of the data acquiring section 38 while the test apparatus 10 is transmitting the write data to the device under test 200. In other words, the masking section 50 masks the data acquisition of the data acquiring sections 38 while the test apparatus 10 is performing the write process to the device under test 200.

The masking section 50 masks the data acquisition of the data acquiring sections 38 at all times other than during the reading process of step S12. Furthermore, even during the reading process of step S12, the masking section 50 masks the data acquisition of the data acquiring sections 38 when the device under test 200 is not outputting a data signal.

By masking the data acquisition of the data acquiring sections 38 during the periods described above, the masking section 50 can mask the data acquisition of the data acquiring sections 38 when the device under test 200 is not outputting a clock signal. During the read process, the masking section 50 removes the masking of the data acquiring sections 38 while the device under test 200 is transmitting the read data to the test apparatus 10, so that the data acquiring sections 38 are able to acquire the data.

Figure 7:
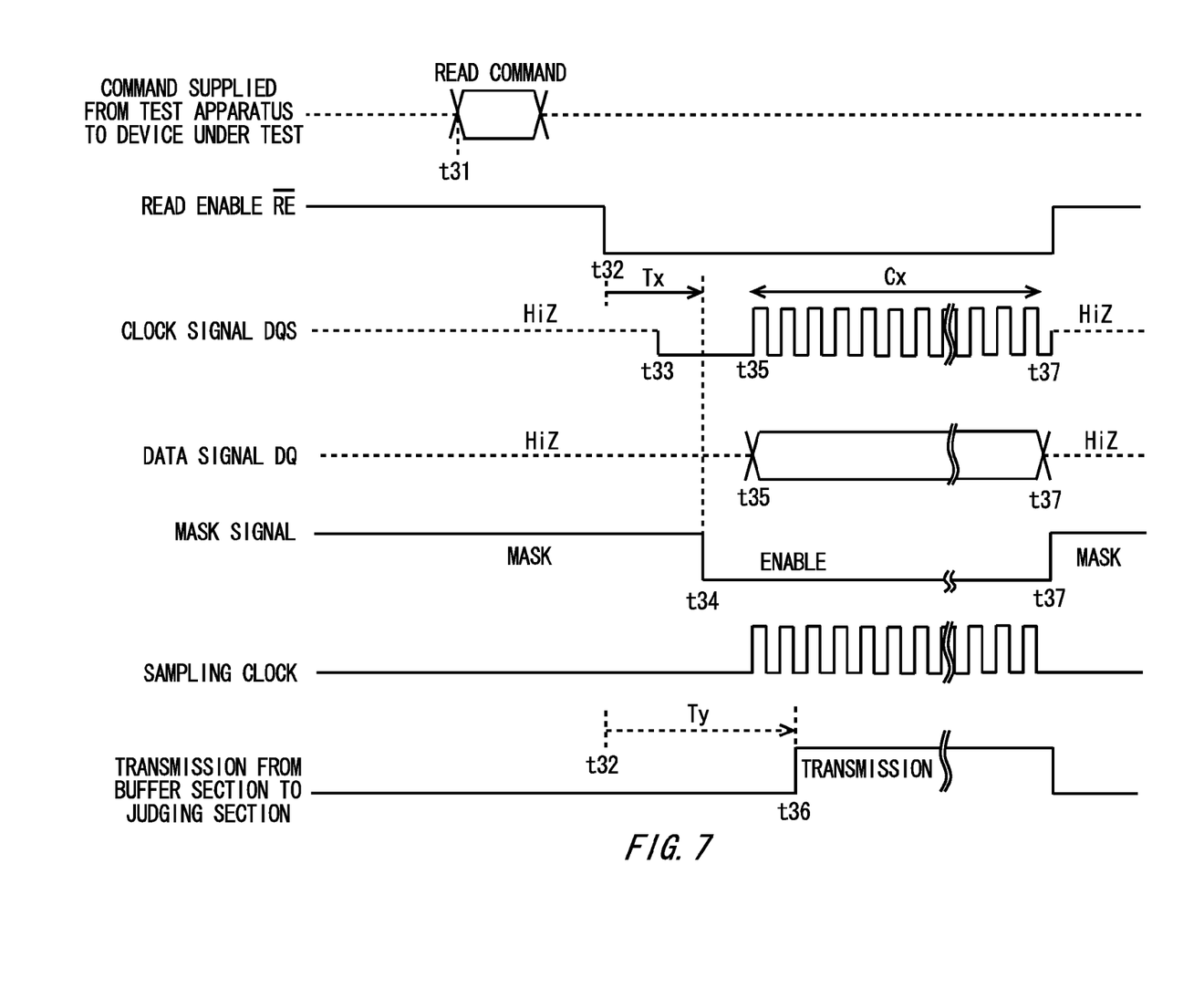
FIG. 7 shows examples of a command and read enable signal transmitted from the test apparatus 10 to the device under test 200, a clock signal and data signal transmitted from the device under test 200 to the test apparatus 10, timing of a mask signal and a sampling clock, and timing of data transmitted from the buffer section 54 to the judging section 42.

FIG. 7 shows examples of a command and read enable signal transmitted from the test apparatus 10 to the device under test 200, a clock signal and data signal transmitted from the device under test 200 to the test apparatus 10, timing of a mask signal and a sampling clock, and timing of data transmitted from the buffer section 54 to the judging section 42. When reading data from a device under test 200 that is a memory device via the DDR interface, the test apparatus 10 performs the following operations.

First, the test signal supplying section 44 of the test apparatus 10 outputs, to the device under test 200 via the DDR interface, the clock signal and data signal indicating the command, e.g. read command, instructing the device under test 200 to output a data signal (time t31). Next, the test signal supplying section 44 supplies the device under test 200 with the read enable signal permitting data output (time t32).

Next, the device under test 200 provided with the read command outputs the data signal DQ including the data value stored at the address indicated by the read command, via the DDR interface, after a prescribed time has passed from when the read command was provided (time t35). Along with this, the device under test 200 outputs the clock signal DQS indicating the sampling timing of the data signal DQ, via the DDR interface (time t35). When the a prescribed number of pieces of data of the data signal DQ has been output, the device under test 200 ends the output of the data signal DQ and the clock signal DQS (time t37).

The device under test 200 has high impedance (HiZ) and does not drive the input/output terminal of the data signal DQ, at all times other than the output time period of the data signal DQ (time t35 to time t37). Furthermore, the device under test 200 fixes the clock signal DQS at a predetermined level, e.g. low logic level, for a prescribed time period (time t33 to time t35) prior to the output time period of the data signal DQ (time t35 to time t37). Furthermore, the device under test 200 has high impedance (HiZ) and does not drive the input/output terminal of the clock signal DQS before the period during which the clock signal DQS is fixed at a predetermined signal level (before time t33) and after the output period of the data signal DQ (time t37).

The data acquiring section 38 of the test apparatus 10 sequentially acquires the data value of the data signal DQ at the timing of the clock signal DQS output from the device under test 200, during a period (time t35 to time t37) in which the device under test 200 outputs the data signal. The data acquiring section 38 sequentially buffers the acquired data in respective entries thereof.

Here, the masking section 50 masks the sampling clock to be a fixed value while the test signal supplying section 44 of the test apparatus 10 is transmitting commands to the device under test 200. Therefore, the masking section 50 can mask the data acquisition while signals are being supplied from the test apparatus 10 to the device under test 200.

Furthermore, the masking section 50 masks the sampling clock to be a fixed value during a period from when a command is output by the test signal supplying section 44 of the test apparatus 10 to when a predetermined reference delay time Tx has passed since the command output. The predetermined reference delay time Tx is a period during which the device under test 200 does not output the clock signal, and may be set according to experimental results and specifications of the device under test 200, for example. Therefore, the masking section 50 can mask the data acquisition while the device under test 200 is not outputting the clock signal.

After the predetermined reference delay time has passed from when the test signal supplying section 44 output a command, the masking section 50 removes the mask from the sampling clock and supplies the sampling clock to the data acquiring sections 38. In this way, the masking section 50 enables the data acquiring sections 38 to reliably acquire data while the clock signal is being output.

After the reference delay time Tx has passed from when the test signal supplying section 44 output a command, on a condition that the clock signal DQS has a predetermined signal level, the masking section 50 may supply the data acquiring sections 38 with the sampling clock corresponding to the clock signal DQS output from the device under test 200. In a source-synchronous interface, immediately before the data signal DQ is output, the clock signal DQS is fixed for a prescribed time at a predetermined signal level, e.g. low logic level. Accordingly, before the clock signal is output, the masking section 50 can reliably set the data acquiring sections 38 to be in a state enabling data acquisition.

After the reference delay time Tx has passed from when the test signal supplying section 44 output a command, on a condition that the clock signal DQS has a predetermined signal level, the masking section 50 may supply the data acquiring sections 38 with the sampling clock corresponding to the clock signal DQS output from the device under test 200. Therefore, after the device under test 200 sets the clock signal DQS to the predetermined signal level, the masking section 50 can switch from a masked state to a data acquisition state.

The number of bits in the read data output from the device under test 200 is determined by the command content, for example. Accordingly, the number of clocks of the clock signal DQS output from the device under test 200 in response to one command is determined by the content of the command provided to the device under test 200. When the number of clocks of the clock signal DQS has reached a reference number of clocks from when the output of the sampling clock corresponding to the clock signal DQS output from the device under test 200 began, the masking section 50 masks the sampling clock with a fixed value to stop the sampling clock from being provided to the data acquiring sections 38. In this way, the masking section 50 can switch with accurate timing from a state in which the sampling clock is supplied to a state in which the sampling clock is masked as a fixed value.

The test apparatus 10 of the present embodiment described above can prevent the data output from the device under test 200 from being acquired during a period in which the device under test 200 does not output the data signals and the clock signal. In other words, when the device under test 200 is in a high impedance state and is not driving the input/output terminals of the data signals and the clock signal, the test apparatus 10 can prevent data from being acquired. Therefore, the test apparatus 10 can perform accurate testing without acquiring uncertain data.

Furthermore, after a predetermined time Ty has passed from when the read enable signal was output by the test signal supplying section 44, the judging section 42 of the test apparatus 10 receives the data signal from the buffer section 54 and compares the data signal to the expected value. In this example, the judging section 42 receives the data signal from the buffer section 54 at time t36, after at least the prescribed time Ty has passed from time t32.

For example, the judging section 42 may receive the data signal from the buffer section 54 after a certain time, which is greater than or equal to the maximum delay time from when the predetermined read enable signal is received to when the data signal is output, as determined by the specifications of the device under test 200, has passed from when the test signal supplying section 44 output the read enable signal. In this way, the judging section 42 can avoid making a judgment based on invalid data read from the buffer section 54 prior to the data signal output from the device under test 200 being buffered in the buffer section 54. Accordingly, the test apparatus 10 can reliably acquire the data signals output by the device under test 200 to perform testing.

When there is a delay in the time from when the acquiring section 52 acquires the data signal to when the buffer section 54 acquires the data signal, the judging section 42 receives the data signal from the buffer section 54 after a time has passed that is equal to the sum of the delay time of the acquiring section 52 and the maximum delay time that is from when the read enable signal is provided to when the data signal is output. Furthermore, the number of entries in the buffer section 54 is preferably greater than or equal to the number of pieces of data that can be output by the device under test 200 during a time period corresponding to the maximum delay time of the device under test 200. Therefore, even if the data signals output from the device under test 200 are delayed by the maximum delay time from when the read enable signal is provided, the buffer section 54 can buffer the data signals and prevent an overflow.

In the manner described above, the test apparatus 10 of the present embodiment compares the data signals buffered in the buffer section 54 to the expected value after a predetermined time has passed from when the read enable signal was provided to the device under test 200. Therefore, the test apparatus 10 can avoid beginning the judgment before the data signals output from the device under test 200 are buffered in the buffer section 54, and can therefore reliably acquire the data signals output from the device under test 200 to perform testing.

Figure 8:
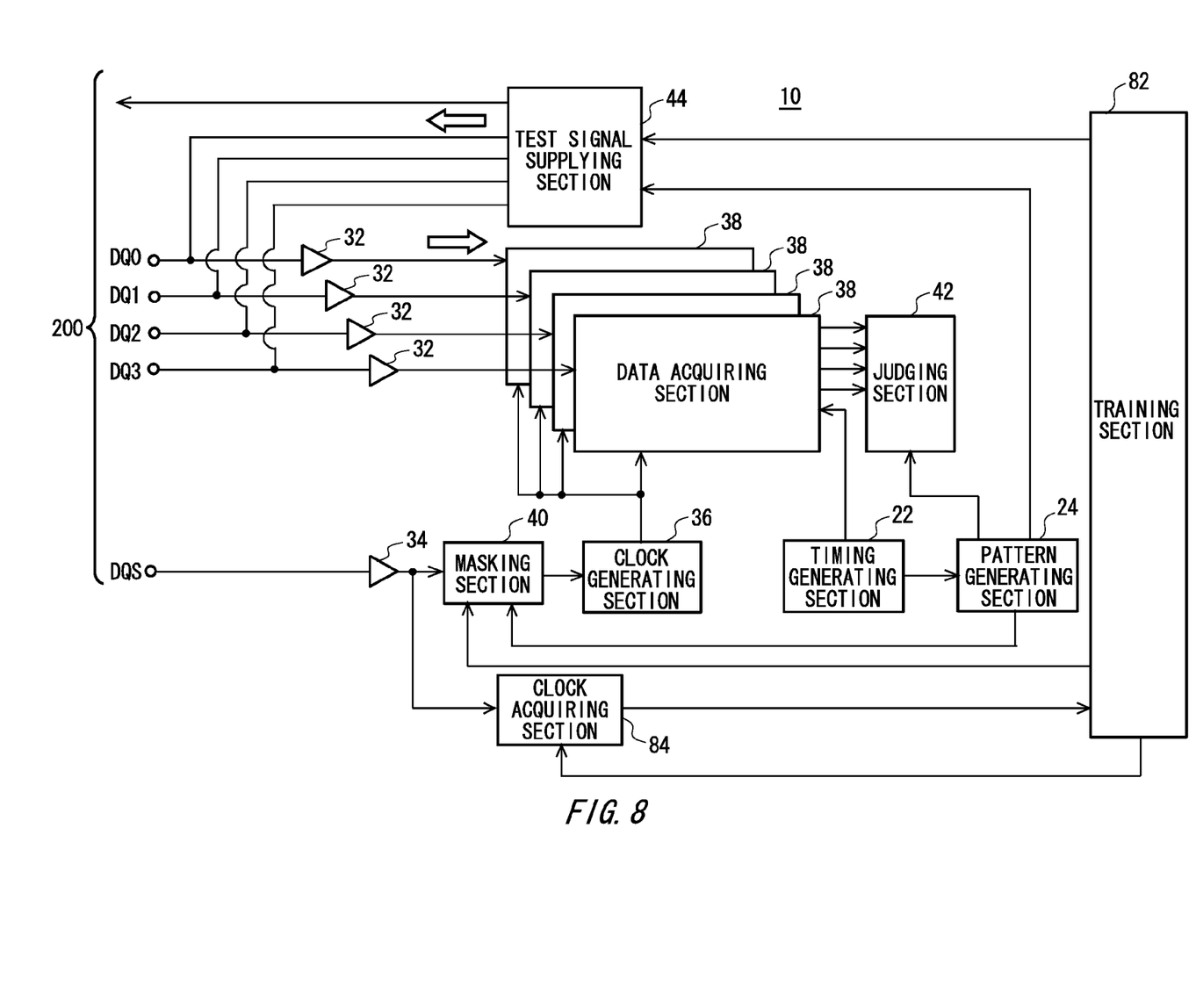
FIG. 8 shows a configuration of a test apparatus 10 according to a modification of the present embodiment.

FIG. 8 shows a configuration of a test apparatus 10 according to a modification of the present embodiment. The test apparatus 10 of the present modification adopts substantially the same function and configuration as the test apparatus 10 according to the embodiment shown in FIG. 3, and therefore components that have substantially the same function and configuration as those shown in FIG. 3 are given the same reference numerals and redundant descriptions are omitted.

The test apparatus 10 further includes a training section 82 and a clock acquiring section 84. Prior to testing of the device under test 200, the training section 82 measures the delay time from when a command is output to the device under test 200 to when a valid clock signal is received from the device under test 200. More specifically, the training section 82 controls the test signal supplying section 44, and causes the test signal supplying section 44 to transmit a command, e.g. a read command, that instructs the device under test 200 to output a data signal. The training section 82 measures the delay time from when the command is transmitted form the test signal supplying section 44 to when the valid clock signal is received from the device under test 200.

The clock acquiring section 84 acquires the clock signal output by the device under test 200. The clock acquiring section 84 detects whether the clock signal output from the device under test 200 has been acquired.

Figure 9:
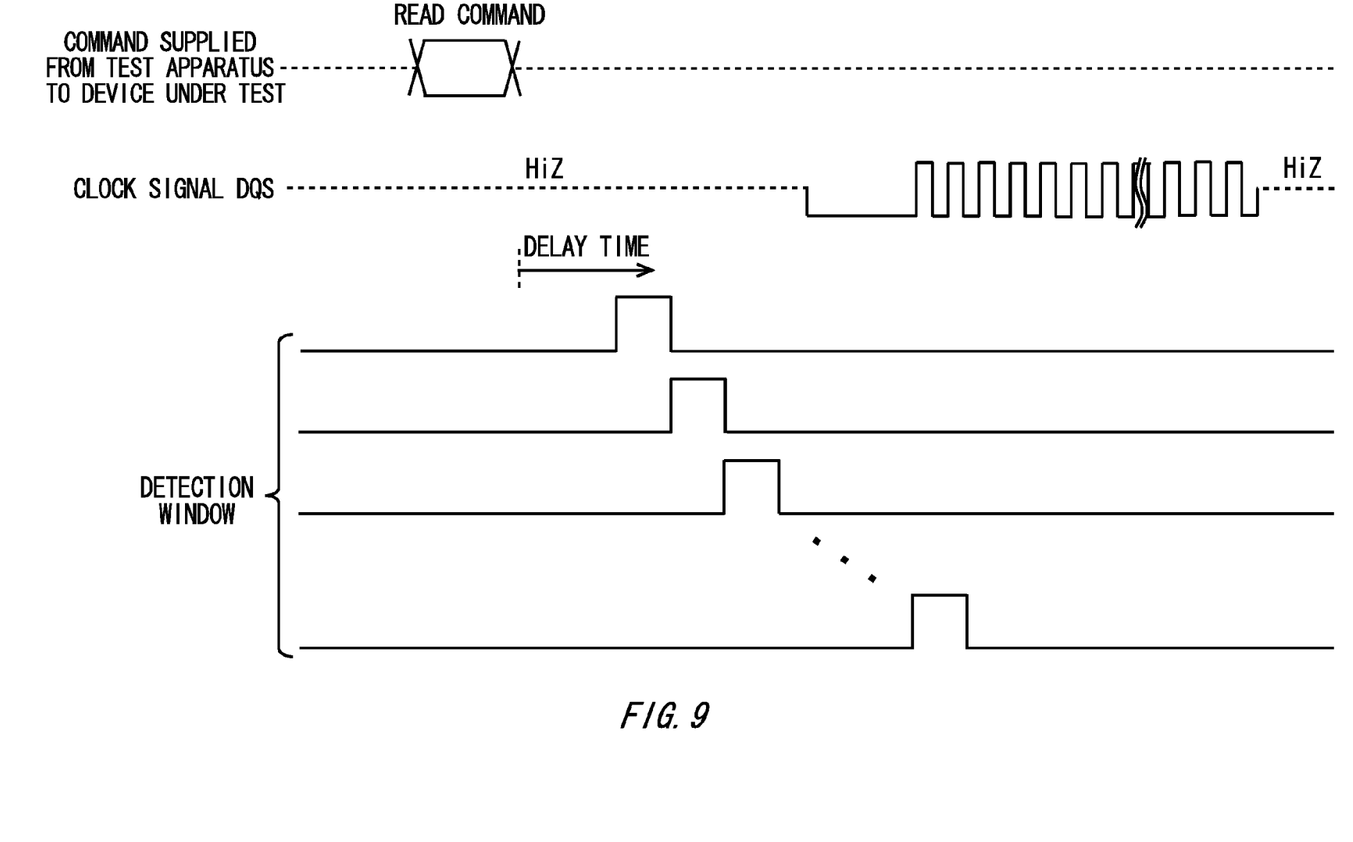
FIG. 9 shows an exemplary clock acquisition timing of the test apparatus 10 according to the present modification.

FIG. 9 shows an exemplary clock acquisition timing of the test apparatus 10 according to the present modification. Prior to testing of the device under test 200, the training section 82 repeatedly outputs from the test signal supplying section 44 a command, e.g. a read command, instructing the device under test 200 to output a data signal. In this way, the test signal supplying section 44 transmits a command, e.g. a read command, to the device under test 200 a plurality of times.

Furthermore, each time a command is output from the test signal supplying section 44, the training section 82 causes the clock acquiring section 84 to acquire the clock signal. In this case, the training section 82 changes the timing at which the clock acquiring section 84 acquires the clock signal, for each command. The training section 82 measures the delay time from when the read command is provided to when the clock signal is output, based on the results of obtaining the clock signal for each command.

For example, for each read command, the training section 82 sets in the clock acquiring section 84 a detection window for measuring the time width for judging whether the clock signal has been output. In this case, the training section 82 moves the position of the detection window for each read command. The clock acquiring section 84 judges whether the clock signal was acquired within the set detection window, for each read command. For example, the clock acquiring section 84 may detect whether a pulse signal whose logic level inverts is acquired within the detection window.

When this type of detection is used, the position of the earliest detection window in which the clock acquiring section 84 was able to acquire the clock signal is the delay time until the valid clock signal is received from the device under test 200. In this way, the training section 82 can measure the delay time from when the device under test 200 is supplied with the read command to when the device under test 200 outputs the clock signal.

The training section 82 sets a reference delay time corresponding to the measured delay time in the masking section 50. During testing, the masking section 50 uses the reference delay time corresponding to the delay time measured by the training section 82 to output the sampling clock corresponding to the clock signal from the device under test 200.

In the manner described above, even if the time from when a command is received to when a data signal is output is different for each of a plurality of devices under test 200, the test apparatus 10 can accurately measure the reference delay time for each device under test 200. Therefore, the test apparatus 10 can accurately switch between a masked state and an enabled state for sampling clock output, at a timing at which the device under test 200 begins outputting the read data.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test outputting a data signal and a clock signal indicating a timing at which the data signal is to be sampled, the test apparatus comprising:
   a data acquiring circuit that acquires the data signal output by the device under test, at a timing corresponding to the clock signal output by the device under test;
   a judging circuit that judges pass/fail of the device under test based on a result of a comparison between the data signal acquired by the data acquiring circuit and an expected value; and
   a masking circuit that masks the acquisition of data by the data acquiring circuit, while the device under test is not outputting the clock signal, so as to prevent the judging circuit from making a judgment based on invalid data.

2. The test apparatus according to claim 1, wherein
the data acquiring circuit acquires the data signal output by the device under test, at a timing of a sampling clock corresponding to the clock signal, and
the masking circuit supplies the data acquiring circuit with the sampling clock while the device under test is outputting the clock signal, and sets the sampling clock to be a fixed value while the device under test is not outputting the clock signal.

3. The test apparatus according to claim 2, further comprising a test signal supplying section that supplies a test signal to the device under test, wherein
the test signal supplying section outputs a command instructing the device under test to output the data signal, and
after a predetermined reference delay time has passed from when the test signal supplying section output the command, the masking circuit supplies the data acquiring circuit with the sampling clock corresponding to the clock signal output from the device under test.

4. The test apparatus according to claim 3, further comprising a training section that, prior to testing the device under test, measures a delay time from when the device under test outputs the command to when a valid clock signal is received from the device under test, wherein
after the reference delay time corresponding to the delay time measured by the training section has passed from when the device under test output the command, the masking circuit supplies the data acquiring circuit with the sampling clock.

5. The test apparatus according to claim 4, further comprising a clock acquiring section that acquires the clock signal output by the device under test, wherein the training section:
causes the test signal supplying section to output, a plurality of times, the command instructing the device under test to output the data signal,
causes the clock signal to be acquired while changing the timing at which the clock acquiring section acquires the clock signal for each command output by the test signal supplying section, and
measures the delay time based on a result of the clock signal acquisition by the clock acquiring section.

6. The test apparatus according to claim 3, wherein
after the reference delay time has passed from when the test signal supplying section output the command, on a condition that the clock signal has a predetermined signal level, the masking circuit supplies the data acquiring circuit with the sampling clock corresponding to the clock signal output from the device under test.

7. The test apparatus according to claim 2, wherein
when the number of clocks of the clock signal reaches a reference number of clocks from when the output of the sampling clock corresponding to the clock signal output by the device under test was begun, the masking circuit stops the supply of the sampling clock to the data acquiring circuit.

8. The test apparatus according to claim 2, wherein the data acquiring circuit includes:
an acquiring section that acquires the data signal at a timing corresponding to the sampling clock; and
a buffer section that includes a plurality of entries, buffers the data signal acquired at the timing corresponding to the sampling clock sequentially in the plurality of entries, and sequentially outputs the buffered data signal from the plurality of entries at a timing of a timing signal generated according to a test period of the test apparatus.

9. The test apparatus according to claim 1, wherein
the test apparatus exchanges the data signal and the clock signal with the device under test via a bidirectional bus, and
the masking circuit masks the data acquisition by the data acquiring circuit while the test apparatus is supplying the data signal and the clock signal to the device under test.

10. The test apparatus according to claim 9, wherein
the device under test is a memory device,
the masking circuit masks the sampling clock, which indicates the timing at which the data acquiring circuit acquires the data signal, as a fixed value while the test apparatus is transmitting write data to the device under test, and outputs the sampling clock corresponding to the clock signal output by the device under test while the device under test is transmitting read data to the test apparatus, and
the data acquiring circuit acquires the data signal output by the device under test, at a timing corresponding to the sampling clock output by the masking circuit.

11. The test apparatus according to claim 10, wherein
the test apparatus further transmits a command to the device under test, via the bidirectional bus, and
the masking circuit masks the sampling clock as a fixed value while the test apparatus is transmitting the command to the device under test.

12. A test method performed by a test apparatus that tests a device under test outputting a data signal and a clock signal indicating a timing at which the data signal is to be sampled, the test method comprising:
acquiring, using a data acquiring circuit of the test apparatus, the data signal output by the device under test, at a timing corresponding to the clock signal output by the device under test;
judging, using a judging circuit of the test apparatus, pass/fail of the device under test based on a result of a comparison between the data signal acquired by the data acquiring section and an expected value; and
masking, using a masking circuit of the test apparatus, the acquisition of data by the data acquiring circuit, while the device under test is not outputting the clock signal, so as to prevent the judging circuit from making a judgment based on invalid data.

13. The test method according to claim 12, wherein
the data acquiring circuit acquires the data signal output by the device under test, at a timing of a sampling clock corresponding to the clock signal, and
the masking circuit supplies the data acquiring circuit with the sampling clock while the device under test is outputting the clock signal, and sets the sampling clock to be a fixed value while the device under test is not outputting the clock signal.

14. The test method according to claim 13, further comprising supplying, using a test signal supplying section of the test apparatus, a test signal to the device under test, wherein
the test signal supplying section outputs a command instructing the device under test to output the data signal, and
after a predetermined reference delay time has passed from when the test signal supplying section output the command, the masking circuit supplies the data acquiring circuit with the sampling clock corresponding to the clock signal output from the device under test.

15. The test method according to claim 14, further comprising measuring, using a training section of the test apparatus, prior to testing the device under test, a delay time from when the device under test outputs the command to when a valid clock signal is received from the device under test, wherein
after the reference delay time corresponding to the delay time measured by the training section has passed from when the device under test output the command, the masking circuit supplies the data acquiring circuit with the sampling clock.

16. The test method according to claim 15, further comprising acquiring, using a clock acquiring section of the test apparatus, the clock signal output by the device under test, wherein the training section:
causes the test signal supplying section to output, a plurality of times, the command instructing the device under test to output the data signal,
causes the clock signal to be acquired while changing the timing at which the clock acquiring section acquires the clock signal for each command output by the test signal supplying section, and
measures the delay time based on a result of the clock signal acquisition by the clock acquiring section.

17. The test method according to claim 14, wherein
after the reference delay time has passed from when the test signal supplying section output the command, on a condition that the clock signal has a predetermined signal level, the masking circuit supplies the data acquiring circuit with the sampling clock corresponding to the clock signal output from the device under test.

18. The test method according to claim 13, wherein
when the number of clocks of the clock signal reaches a reference number of clocks from when the output of the sampling clock corresponding to the clock signal output by the device under test was begun, the masking circuit stops the supply of the sampling clock to the data acquiring circuit.

19. The test method according to claim 13, wherein the data acquiring circuit includes:
an acquiring section that acquires the data signal at a timing corresponding to the sampling clock; and
a buffer section that includes a plurality of entries, buffers the data signal acquired at the timing corresponding to the sampling clock sequentially in the plurality of entries, and sequentially outputs the buffered data signal from the plurality of entries at a timing of a timing signal generated according to a test period of the test apparatus.

20. The test method according to claim 12, wherein
the test apparatus exchanges the data signal and the clock signal with the device under test via a bidirectional bus, and
the masking circuit masks the data acquisition by the data acquiring circuit while the test apparatus is supplying the data signal and the clock signal to the device under test.

* * * * *